United States Patent
Abbink et al.

[11] Patent Number: 6,146,025
[45] Date of Patent: Nov. 14, 2000

[54] LASER DIODE AND SUBSTRATE

[75] Inventors: Henry C. Abbink, Westlake Village; Arnold E. Goldman, Calabasas; Agop Cherbettchian, Santa Monica, all of Calif.; Raymond Scott Enochs, Gaston, Oreg.

[73] Assignee: Litton Systems Inc., Woodland Hills, Calif.

[21] Appl. No.: 09/128,096

[22] Filed: Aug. 3, 1998

[51] Int. Cl.[7] .................................................. G02B 6/36
[52] U.S. Cl. ............................................. 385/88; 385/92
[58] Field of Search .......................................... 385/88–94

[56] References Cited

U.S. PATENT DOCUMENTS 5,412,748  5/1995  Furuyama et al. .................. 385/92
5,719,979  2/1998  Furuyama ........................... 385/91

*Primary Examiner*—Hung N. Ngo
*Attorney, Agent, or Firm*—James F. Kirk

[57] ABSTRACT

An improved laser diode is taught. A laser diode chip with an optical port for outputing an optical signal is mounted on a substrate. The substrate has a perimeter that extends beyond the area of the laser diode chip. The lens face of an optical fiber is aligned to receive the optical signal from the optical port. The optical fiber is secured at a pad location on the substrate with a solder ball. A portion of the substrate is mounted on a TEC leaving an overhang portion unsupported by the TEC. The overhang portion of the substrate forms a ledge portion of the substrate. A thermal insulating slot and a stress relief slot are micromachined through the substrate forming an "L" shaped slot defining a cantilever fiber support segment of the substrate. The fiber is mounted on the end of the fiber support segment with a solder ball.

15 Claims, 2 Drawing Sheets

LASER DIODE AND SUBSTRATE

This invention was made support under Contract awarded by the U.S. Department of the Army under Army/MICOM Contract DAAH01-95-C-R 128. The Government of The United States has certain rights in this invention.

BACKGROUND OF THE INVENTION

1. Field of Invention

The invention relates to the field of optical components such as solid state laser diodes and particularly to the field of light sources for fiber optic applications. The invention provides for improved alignment of pigtails or optical fiber used to couple light from an optical source out of a package for use in an application. Use of the invention in the fabrication of solid state laser diodes will reduce the cost, and increase the performance and uniformity of such products.

2. Related Art And Background

Fabrication of solid state laser diodes requires that the optical port on a laser diode chip be aligned with the polished end of an optical fiber. The laser diode product is made by metalizing an alumina substrate in predetermined areas, soldering a laser diode chip to one of the predetermined areas, soldering the substrate to a TEC or to a stack of TEC coolers. An optical fiber is prepared with metalization.

The optical fiber or pigtail is then aligned to receive the greatest amount of light from the optical port before it is soldered to the substrate. The assembly is then temperature cycled to relieve stresses on the substrate that tend to cause miss-alignment. The assembly process is concluded with a final test to see if the retained output power has remained within acceptable limits. There is a possibility that a device that had good retained power before mounting might have inadequate retained power after mounting and thermal cycling. Output power is sometimes lost as a result of warping of the substrate during the mounting process or during a reflow process.

Substrate warping and cracking is sometimes caused by the heat that must be applied to the substrate to melt the solder ball used to attach the optical fiber to the substrate. All components being mounted to the substrate or the TEC using metallurgical bonding, the substrate provides a low thermal resistance path to the laser chip and to the TEC thereby increasing the amount of heat that has to be delivered to the solder ball and the substrate to melt the solder ball. In addition to a larger amount of heat, the duration of the application of the larger amount of heat is extended because heat is drawn away from the work by the TEC.

SUMMARY OF INVENTION

This invention teaches an improved laser diode using a substrate mounted on a heat sink, the substrate being displaced on the heat sink or TEC to form a ledge or overhang area on which the optical fiber is mounted. The optical fiber is soldered to a pad on the overhang. The overhang does not conduct heat directly through its thickness to the TEC because there is a void space beneath the solder pad location. A thermal insulating slot is micromachined along a line between the solder pad and a line under which the TEC is attached. A second slot is micromachined from the edge of the substrate to the thermal insulating slot and serves as a stress relief slot. The slots are cut through the entire thickness of the substrate.

In the preferred embodiment, the laser diode puts out about 40 Mw of optical power. The lens system picks up about 50% of that if perfectly coupled. Retained coupled power is what is retained after the fiber is soldered. The slots are micromachined using a YAG laser.

DESCRIPTION OF THE PREFERRED EMBODIMENT

Figure 1:
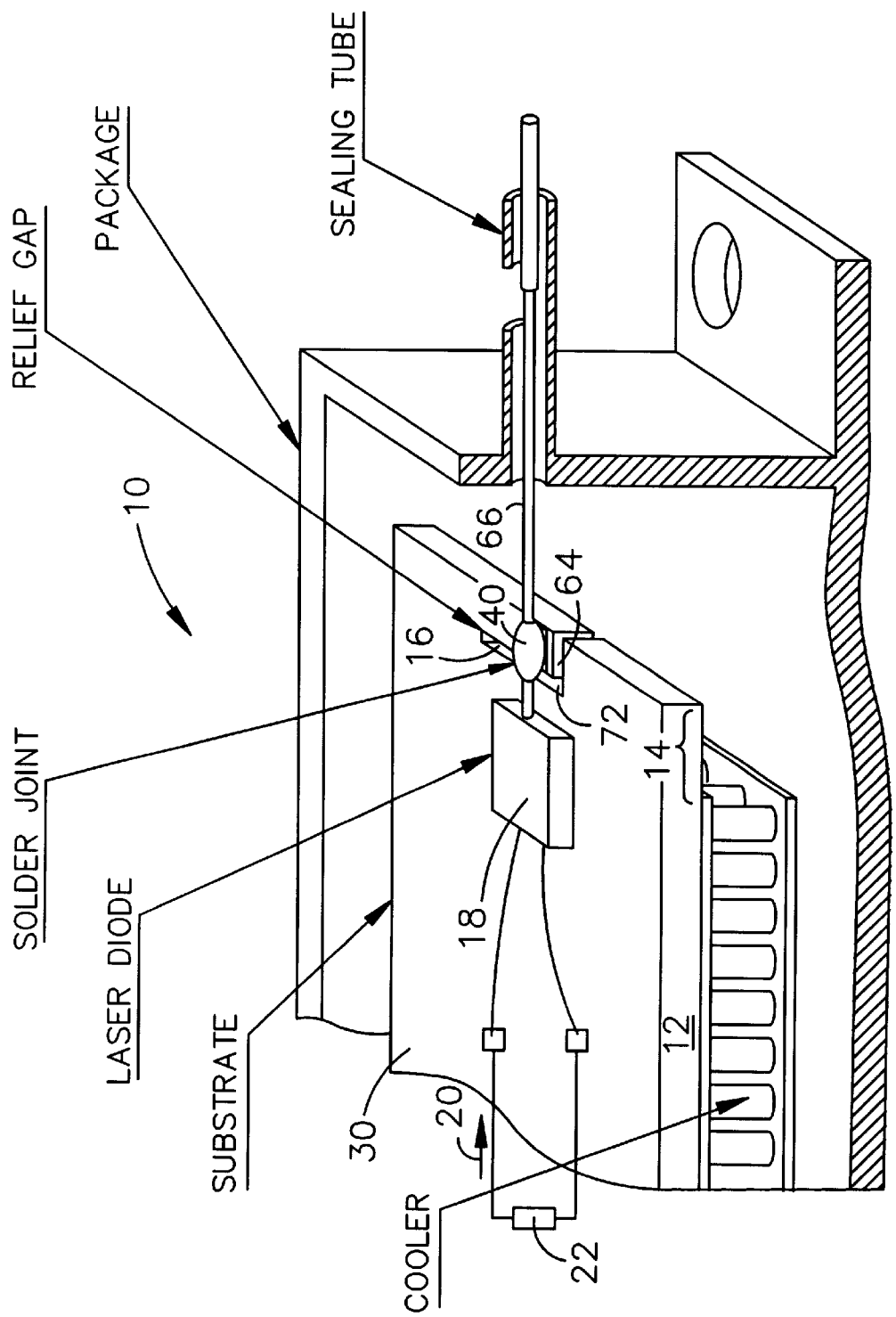
FIG. 1 is a schematic perspective view of sectioned Laser Diode Assembly Using an Improved Substrate

FIG. 1 provides a schematic perspective view representation of the improved laser diode 10 for automated laser diode pigtailing. The invention achieves its objectives because of its use of an improved substrate 12 made of alumina $Al_2O_3$ with a ledge or overhang portion 14 and insulating slot 16, 64 which increase the thermal resistance between the pad location 46 and the TEC. The increased thermal resistance make it possible to melt the solder ball 40 and secure the optical fiber 66 with a much lower thermal shock to the optical chip 18 and the substrate 12.

A laser diode chip 18 is shown mounted on the substrate 12. The laser diode chip responds to a drive current 20 from current source 22 by outputing optical power 24 from an optical port 26 on the laser diode chip 18. A typical drive current might be 300 milliamperes and the Vf (forward voltage drop) on the diode might typically be 1.8 V.

Figure 2:
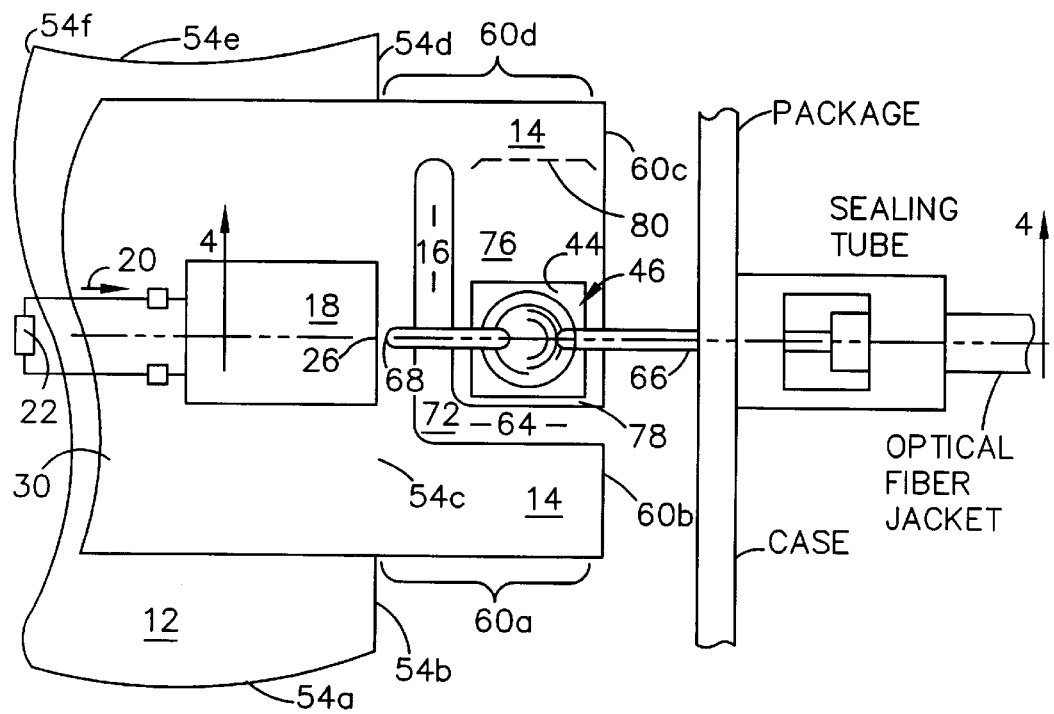
FIG. 2 is a partial schematic top view of the sectioned Laser Diode Assembly of FIG. 1
Figure 3:
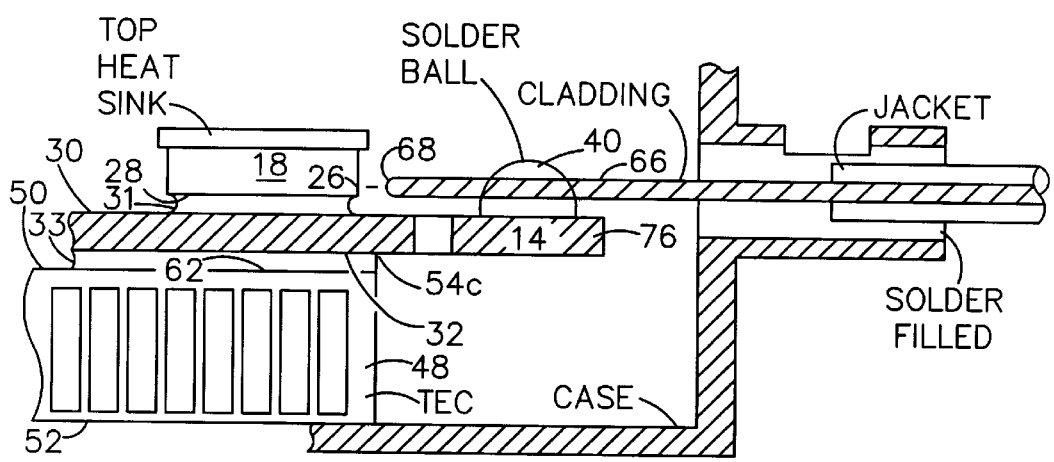
FIG. 3 is a schematic sectional view of FIG. 2 taken on section line 4—4.

Referring to FIG. 2, and FIG. 3, the laser diode chip 18 has a heat sink surface 28 on its base from which heat is sourced to the substrate top surface 30. The heat is produced from internal power dissipation. The laser diode chip 18 outputs optical power from its optical port 26. A first layer of solder 31 is shown between the laser diode heat sink surface 28 and the substrate top surface 30. The substrate 12 receives heat from the laser diode heat sink surface 30 and conducts the heat to a substrate bottom surface 32.

The substrate top surface 30 has a perimeter that encloses an area larger than the area occupied by the laser diode heat sink surface 28. An optical fiber 36 has a first end 38 positioned to couple optical power from the optical port 26 to an optical fiber second end (not shown). A portion of the optical fiber 42 near the first end 38 is metalized and embedded in a solder ball 40 on a pad 44 at a pad location 46 on the substrate 12.

A thermal insulating slot 16 is machined into the substrate 12 between the pad location 46 and the optical port 26 on the laser diode chip 18. A heat sink 48 (TEC) has a heat sink top surface 50 for receiving heat, and a heat sink bottom surface 52 for sourcing or delivering heat. The heat sink top surface has a heat sink perimeter 54a, 54b, 54c and 54d. A portion of the substrate bottom surface 32 is mounted on the heat sink top surface 50. A second layer of solder 33 is shown between the substrate bottom surface 32 and the heat sink top surface 50.

The substrate bottom surface 32 has an overhang portion 14 extending beyond the heat sink perimeter 54b, 54c, 54d. The overhang portion 14 has an overhang perimeter 60a, 60b, 60c, 60d and 54c that contains the pad location 46 and the insulating slot 16.

As shown, the substrate bottom surface 32 is positioned on the heat sink top surface 50 to position the laser diode heat sink surface 28 in an opposing relation with a corresponding area, or directly opposite the area, or footprint on the heat sink top surface 50. Heat leaving the laser diode heat sink surface 28 passes directly through the substrate 12 to a corresponding area on the heat sink top surface 50.

A stress relief slot 64 is machined into the substrate 12. The stress relief slot 64 prevents heat at the solder pad location 46 from extending the partially isolated substrate material under pad 44 and producing stress in the substrate material.

The stress relief slot 64 is extended from the insulating slot 16 to the edge of the overhang portion 14 of the substrate 12. The stress relief slot 64 is extended in a direction selected to reduce thermally induced stress in the substrate 12.

An optical fiber 66 has a lens face 68. In the preferred embodiment, the end of the optical fiber is polished to form a lens. Other producers use GRIN lenses and various other means. FIGS. 2 and 3 show the optical fiber 66 secured at a pad location 46 on the substrate top surface 30 with a solder ball 40. The lens face 68 is positioned close to the optical port 26 to receive optical power from the optical port 26.

The core of the optical fiber is only 5–6 microns in diameter. A slight change in the position of the optical fiber as the result of strain induced by excessive heat applied to the optical pad location 46 or warping of the substrate will reduce the retained power after the solder re-solidifies.

The overhang portion 14 of the substrate 12 extends beyond the heat sink top surface perimeter 54b, 54c, 54d. The overhang portion 14 of the substrate 12 forms a ledge portion of the substrate 70. The insulating slot 16 is formed in the substrate overhang portion 14 between the pad location 46 and the heat sink top surface perimeter 54a–54d. In the embodiments of FIGS. 2 and 3, the heat sink 48 is a TEC (thermo electric cooler).

The laser diode heat sink surface 28 is metallurgical bonded to the substrate top surface 30 and the substrate bottom surface 32 is metallurgical bonded to the heat sink top surface 50. The thermal insulating slot 16 is formed as a slot passing through the substrate 12 and on a line orthogonal to a path from the pad location 46 to the optical port 26. In addition, the stress relief slot 64 is formed as a slot passing through the thickness of the substrate 12 and passing from an edge of the substrate 60b, parallel to a path from the pad location 46 to the optical port 26 and then to the end of the thermal insulating slot 16.

In an alternative embodiment, the combination is for an improved optical component such as a photo transistor of other such device having a substrate 12, the substrate having a top and bottom surface 30, 32 and an "L" shaped slot such as that formed by the combination of the thermal insulating slot 72 and the stress relief slot 64. The "L" shaped slot has a stress relief slot 64 and a thermal insulating slot 16. The stress relief slot 64 begins at an edge 60b of the substrate 12 and terminates at the beginning of the insulating slot 16. The slot is cut all the way through the substrate and there is a void space beneath the cantilever support.

The ledge portion of the overhang portion 58 of the substrate 12 has an outer edge. A channel is micromachined into the edge toward the TEC for a short distance but before reaching the TEC, the channel is turned 90 degrees to extend a for a longer distance parallel with the edge 60b, 60c of the overhang portion 14. The channel thereby forms an alumina cantilever support region or fiber support segment 76 on the overhang portion 58 free of the TEC. Although the cantilever fiber support segment 76 is defined by an "L" shaped slot, it should be apparent that any form of interruption in the thermal path from the pad location 46 to the edge of the TEC will provide a comparable benefit. A row of closely ordered drill hole would probably work instead of a slot. Wavy slot lines or a curved slot line would also work. The slot might not have to pass all of the way through the substrate for the invention to work. A high percentage of penetration would probably work if it was necessary to preserve a surface on the substrate. The overhang or ledge feature is essential.

The fiber support segment 76 surface 30 is prepared to receive solder at the location of the laser diode and at the pad location 46 on the cantilever fiber support segment 76. A laser diode is positioned on the substrate, registered at a predetermined location, oriented and soldered to the alumina substrate. The substrate 12 is then mounted via a solder preform on a TEC 48 or on a multiple stack of TEC's 48.

The "L" shaped slot defines a partial border 74 around the fiber support segment 76 or region of the substrate 12 having a tip end 78 and a root end 80. A pad 44 for receiving a solder ball 40 is positioned on the top surface of the fiber support segment 76.

A solder preform is positioned on the cantilever fiber support segment 76. A fiber optic fiber is prepared by removing the jacket material to provide a clear length of exposed cladding. The fiber cladding is prepared a NiAg coating for soldering. The input end of the fiber is polished to form a receiving lens surface. An output end of the fiber is coupled to power measuring instrumentation capable of associating a series of measured powers out of the fiber with respective X-Y coordinate locations for each measurement. A solder preform is positioned on the pad 44 at the pad location 46 the cantilever surface.

An optical component, such as a photo-transistor or laser diode 18 with an optical port 26 is mounted on the substrate 12. In this alternative embodiment, an optical fiber 66 has a polished end or lens face 68. A preferred embodiment forms the end of the fiber into a cone (not shown) for optimal performance and reception of light from the optical port 26. The optical fiber 66 is aligned to optically couple the polished end or lens face 68 to the optical port 26. The optical fiber 66 is mounted on the fiber support segment 78 by being embedded in the solder ball 40.

In a process, the improved optical component is formed as a light source. A laser diode chip 18 transmits light through the optical port to the polished end or lens face 68 of an optical fiber. 66 The optical coupling of light into the polished end or lens face 68 is improved by the steps of scanning the position of the polished end or lens face in a window close to the optical port to map the optical power received at numerous locations in the window.

The solder preform or ball 40 is melted as the optical fiber 66 is concurrently positioned in the melted solder ball to a mapped location expected to produce greatest optical power. Melting of the solder ball and moving the optical fiber occurs concurrently. Minimal energy is required to melt the solder ball because the overhang portion of the substrate is not heat sunk and the thermal insulating slot 16 provides a barrier for heat moving from the fiber support segment 76 to the heat sink 48.

The alignment of the optical begins with the step of measuring the power received by the optical fiber, at each location in an array of locations identified by coordinates, before the optical fiber is embedded in a solder ball on the substrate to determine the location to move the fiber to for maximum expected retained power.

The fiber is initially gripped by a clamp or holder (not shown). The system then locates the end of the fiber close to the laser diode light source. The position of the input end of the fiber is then scanned by operation of a computer controlled scanning apparatus using encoder controlled linear motors. A scanning apparatus of this type is taught in U.S. Patent 5,926,594 issued Jul. 20, 1999, filed Jun. 7, 1995 for docket GCD 94–33=>40 and related divisional cases by Ike Song et al and having a common assignee for an Automated Pigtailing System for MIOC the contents of which are incorporated by reference. A notice of allowance has recently issued on this case. The fiber is held in a fixed position and the case containing the substrate and the laser chip is moved to achieve the scan.

The scan moves the case through the array of locations by a sequential machine driven by linear motors, the drive having high resolution encoders, so that coordinate locations are identified with high precision and each location recorded is re-locatable. The solder preform or ball is melted by firing a laser beam at the solder preform.

The optical fiber is moved by moving the case to a predetermined position contemporaneous with the laser firing and melting of the solder preform as the preform reaches the melted phase. The amount of energy required to melt the solder ball was determined experimentally for a production unit. Once determined, the amount of energy required remains unchanged from one unit to the next. The laser (not shown) is programmed to apply a predetermined number of joules to the solder preform on the cantilever fiber support surface 76. The laser is programmed to output a pulse of about 5 watts.

The location of the optical fiber is changed to the new location at the same instant that the solder ball is melted by the laser beam. Another advantage of the invention process is that there is no physical contact with the solder ball. The soldering is fluxless. An inert gas is used to shroud the solder ball as it is melted and cooled. If the alignment desired is not achieved, the process is repeated to achieve a better result. The process can be iterated.

Although the invention has been disclosed and illustrated in detail, it is to be understood that the same is by way of illustration as an example only and is not to be taken by way of limitation. The spirit and scope of this invention is to be limited only by the terms of the appended claims.

What is claimed is:

1. An improved laser diode using a substrate with an insulating slot comprising:
   a laser diode chip responsive to a drive current for outputting optical power from an optical port on the laser diode chip, the laser diode chip having a heat sink surface with which to source heat resulting from internal power dissipation,
   a substrate having a substrate top surface on which the laser diode heat sink surface is mounted, the substrate receiving and conducting heat from the laser diode heat sink surface to a substrate bottom surface, the substrate top surface having a perimeter that encloses an area larger than the area occupied by the laser diode heat sink surface,
   an optical fiber having a first end, the first end being positioned to couple optical power from the optical port to a second end, a portion of the optical fiber near the first end being embedded in a solder ball on a pad at a pad location on the substrate; and
   an insulating slot machined into the substrate between the pad location and the optical port.

2. The improved laser diode of claim 1 further comprising a heat sink having a heat sink top surface for receiving heat, and a heat sink bottom surface, the heat sink top surface having a heat sink perimeter, a portion of the substrate bottom surface being mounted on the heat sink top surface, the substrate bottom surface having an overhang portion extending beyond the heat sink perimeter, the overhang portion having an overhang perimeter containing the pad location and the insulating slot.

3. The improved laser diode of claim 1 further comprising: a heat sink having a heat sink top surface for receiving heat, the heat sink top surface having a perimeter, a portion of the substrate bottom surface being mounted on the heat sink top surface, the substrate bottom surface having an overhang portion extending beyond the perimeter of the heat sink top surface, the overhang portion having a perimeter containing the pad location and the insulating slot, and wherein the substrate bottom surface exclusive of the overhang portion is positioned on the heat sink top surface to position the laser diode heat sink surface in an opposing relation with a corresponding area on the heat sink top surface.

4. The improved laser diode of claim 1 further comprising:
   a heat sink having a heat sink top surface for receiving heat, the heat sink top surface having a perimeter, a portion of the substrate bottom surface being mounted on the heat sink top surface, the substrate bottom surface having an overhang portion extending beyond the perimeter of the heat sink top surface, the overhang portion having a perimeter containing the pad location and the insulating slot, and wherein the substrate bottom surface is positioned on the heat sink top surface to position the laser diode heat sink surface in an opposing relation with a corresponding area on the heat sink top surface and wherein the substrate further comprises:
   a stress relief slot machined in the substrate extending from the insulating slot in a direction selected to reduce thermally induced stress in the substrate.

5. An improved laser diode comprising:
   a laser diode chip, having an optical port for outputting an optical signal and at least one laser diode heat sink surface,
   a substrate having a top and bottom surface, the laser diode heat sink surface being mounted on the top surface, the substrate top surface having a perimeter that extends beyond the area of the laser diode heat sink surface;
   an optical fiber having a lens face, the optical fiber being secured at a pad location on the substrate top surface with a solder ball, the receiving lens face being positioned close to the optical port to receive optical power from the optical port,
   a heat sink having a top surface, the heat sink top surface having a perimeter,
   a portion of the substrate bottom surface being mounted on the heat sink top surface, an overhang portion of the substrate extending beyond the heat sink top surface perimeter, the overhang portion of the substrate forming a ledge portion of the substrate,
   a thermal insulating slot being formed in the substrate overhang portion between the pad location and the heat sink top surface perimeter,
   a stress relief slot being formed in the overhang portion of the substrate, the stress relief slot extending from the edge of the substrate to an end of the thermal insulating slot.

6. The improved laser diode of claim 5 wherein the heat sink is a TEC.

7. The improved laser diode of claim 5 wherein the heat sink is a TEC and the laser diode heat sink surface is in opposing relation to the heat sink top surface at all points on the laser diode heat sink surface.

8. The improved laser diode of claim 5 wherein the heat sink is a TEC and the laser diode heat sink surface is in opposing relation to the heat sink top surface at all points on the laser diode heat sink surface, and wherein the laser diode heat sink surface is metallurgical bonded to the substrate top surface and the substrate bottom surface is metallurgical bonded to the heat sink top surface.

9. The improved laser diode of claim 5 wherein the heat sink is a TEC and the laser diode heat sink surface is in opposing relation to the heat sink top surface at all points on the laser diode heat sink surface, and wherein:

the thermal insulating slot is formed as a slot passing through the substrate and on a line orthogonal to a path from the pad location to the optical port.

10. The improved laser diode of claim 5 wherein the heat sink is a TEC and the laser diode heat sink surface is in opposing relation to the heat sink top surface at all points on the laser diode heat sink surface, and wherein:

the thermal insulating slot is formed as a slot passing through the substrate and on a line orthogonal to a path from the pad location to the optical port and the stress relief slot is formed as a slot passing through the substrate and passing from an edge of the substrate, parallel to a path from the pad location to the optical port, to an end of the thermal insulating slot.

11. An laser diode comprising:

a substrate having a top and bottom surface and an "L" shaped slot, the "L" shaped slot having a stress relief slot and a thermal insulating slot, the stress relief slot beginning at an edge of the substrate and terminating at the beginning of the insulating slot, the "L" shaped slot defining a border around a canteleverd fiber support segment, a pad for receiving a solder preform is positioned on the surface of the fiber support segment, an optical component having an optical port, the optical component being mounted on the substrate, an optical fiber having a lens face, the optical fiber being aligned to optically couple the lens face to the optical port, the optical fiber being mounted on the substrate by being embedded in the solder from the solder preform.

12. The improved optical component of claim 11 wherein the optical component is a laser diode chip and the optical port transmits light to the lens face of the optical fiber.

13. The improved optical component of claim 11 wherein the optical component is semiconductor chip responsive to light received at its optical port from the lens face of the fiber.

14. The improved optical component of claim 11 wherein the optical component is a laser diode chip and the optical port transmits light to the lens face of the optical fiber, the optical coupling being improved by the steps of scanning the position of the lens face in a window close to the optical port to map the optical power received at numerous locations in the window, melting the solder and positioning the optical fiber in the melted solder to a mapped location expected to produce greatest optical power.

15. The improved optical component of claim 14 further comprising the steps of measuring the power received by the optical fiber, determining if the retained power is inadequate, remelting the solder and concurrently moving the position of the optical fiber to a corrected location for improved coupling.

* * * * *

(12) EX PARTE REEXAMINATION CERTIFICATE (6931st)
United States Patent
Abbink et al.

(10) Number: US 6,146,025 C1
(45) Certificate Issued: Jul. 14, 2009

(54) LASER DIODE AND SUBSTRATE

(75) Inventors: Henry C. Abbink, Westlake Village, CA (US); Arnold E. Goldman, Calabasas, CA (US); Agop Cherbettchian, Santa Monica, CA (US); Raymond Scott Enochs, Gaston, OR (US)

(73) Assignee: Litton Systems Inc., Woodland Hills, CA (US)

Reexamination Request:
No. 90/008,328, Feb. 1, 2007

Reexamination Certificate for:
Patent No.: 6,146,025
Issued: Nov. 14, 2000
Appl. No.: 09/128,096
Filed: Aug. 3, 1998

(51) Int. Cl.
*G02B 6/36* (2006.01)

(52) U.S. Cl. .......................................... 385/88; 385/92

(58) Field of Classification Search .................... None
See application file for complete search history.

(56) References Cited

U.S. PATENT DOCUMENTS 4,807,956 A   2/1989   Tournereau et al.

*Primary Examiner*—Minh T Nguyen

(57) ABSTRACT

An improved laser diode is taught. A laser diode chip with an optical port for outputing an optical signal is mounted on a substrate. The substrate has a perimeter that extends beyond the area of the laser diode chip. The lens face of an optical fiber is aligned to receive the optical signal from the optical port. The optical fiber is secured at a pad location on the substrate with a solder ball. A portion of the substrate is mounted on a TEC leaving an overhang portion unsupported by the TEC. The overhang portion of the substrate forms a ledge portion of the substrate. A thermal insulating slot and a stress relief slot are micromachined through the substrate forming an "L" shaped slot defining a cantilever fiber support segment of the substrate. The fiber is mounted on the end of the fiber support segment with a solder ball.

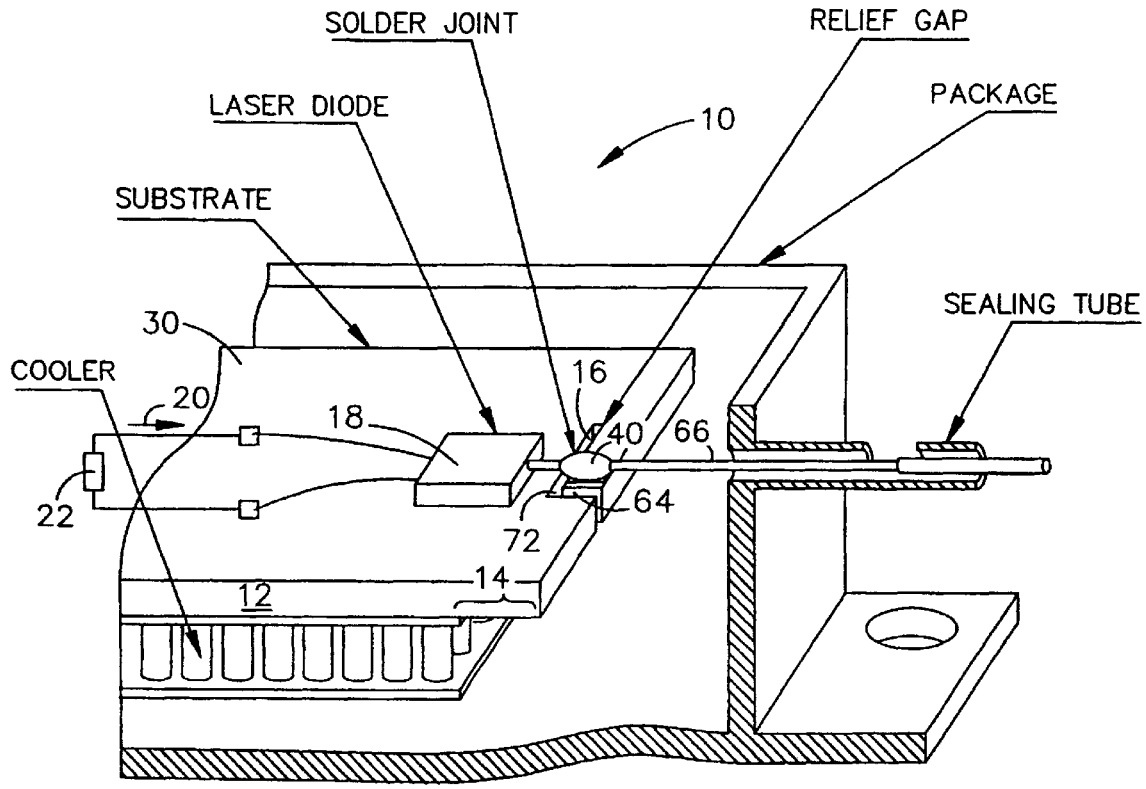

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2–4 are cancelled.

Claim 1 is determined to be patentable as amended.

New claims 16–22 are added and determined to be patentable.

Claims 5–15 were not reexamined.

1. An improved laser diode (*10*) using a substrate with an insulating slot comprising:

a laser diode chip (*18*) response to a drive current for outputting optical power from an optical port on the laser diode chip, the laser diode chip having a heat sink surface with which to source heat resulting from internal power dissipation;

*an optical fiber (66) aligned with the laser diode chip (18) disposed on a surface of* a substrate [having a substrate top surface on which the laser diode] (*12*), *the substrate (12) being attached to a* heat sink (*48*) *at the other* surface [is mounted], the substrate [receiving and conducting heat from the laser diode heat sink surface to a substrate bottom surface, the substrate top surface having a perimeter than encloses an area larger that the area occupied by the laser diode heat sink surface, an] (*12*) *having an overlay portion (14) that extends beyond the heat sink (48), the overlay portion (14) including a cantilever support segment (76) supporting a pad (44), the end of the* optical fiber [having a first end, the first end being positioned to couple optical power from the optical port to a second end, a portion of the optical fiber near the] (*66*) *being attached to the pad (44), at a first end* [being] *and* embedded in a solder ball on [a] pad [at a pad location on the substrate; and an insulating] (*44*), *a thermal insulating slot (16) formed through the substrate (12) in the overlay portion (14) between the laser diode chip (18) and the pad (44), a stress relief* slot [machined into the] (*64*) *formed through the* substrate [between the pad location and the optical port] (*12*) *in the overlay portion (14) and extending from an edge of the substrate (12) to the thermal insulating slot (16), to prevent substrate warping.*

*16. The laser diode (10) of claim 1 wherein the thermal insulating slot (16) and stress relief slot (64) are straight.*

*17. The laser diode (10) of claim 1 wherein the thermal insulating slot (16) and stress relief slot (64) are curved or wavy.*

*18. The laser diode (10) of claim 1 wherein the thermal insulating slot (16) and stress relief slot (64) substantially form an "L" shape.*

*19. The laser diode (10) of claim 1 wherein the stress relief slot (64) extends to the edge of the substrate (12) in a topography that substantially isolates the pad (44).*

*20. The laser diode (10) of claim 1 wherein the laser chip (18) has a heat sink surface (28) that is in opposing relation to a surface (62) of the heat sink (48).*

*21. The laser diode (10) of claim 1 wherein*
   *the laser diode chip (18) includes an optical port (26), and the optical fiber (66) has an end (68), the end (68) being optically coupled with the optical port (26).*

*22. The laser diode (10) of claim 1 wherein the optical port (26) transmits light to the end (68) of the optical fiber (66).*

\* \* \* \* \*